United States Patent [19]

Onishi et al.

[11] Patent Number: 5,139,964
[45] Date of Patent: Aug. 18, 1992

[54] METHOD FOR FORMING ISOLATION REGION OF SEMICONDUCTOR DEVICE

[75] Inventors: Shigeo Onishi; Kenichi Tanaka, both of Nara; Yoshimitsu Yamauchi, Yamatokoriyama; Keizo Sakiyama, Kashiwara, all of Japan

[73] Assignee: Sharp Kabushiki Kaisha, Osaka, Japan

[21] Appl. No.: 646,203

[22] Filed: Jan. 28, 1991

[30] Foreign Application Priority Data

Feb. 2, 1990 [JP] Japan ................................ 2-24968

[51] Int. Cl.$^5$ ........................................... H01L 21/76
[52] U.S. Cl. ........................................ 437/70; 437/947; 437/981; 437/73
[58] Field of Search ............... 437/69, 70, 72, 73, 437/947, 981; 148/DIG. 161

[56] References Cited

U.S. PATENT DOCUMENTS 4,965,221 10/1990 Dennison et al. .................... 437/70

FOREIGN PATENT DOCUMENTS

| 2616677 | 11/1976 | Fed. Rep. of Germany | 437/72 |
|---|---|---|---|
| 61-283147 | 12/1986 | Japan | 437/69 |
| 62-13047 | 1/1987 | Japan | 437/69 |
| 63-280437 | 11/1988 | Japan | 437/73 |
| 63-296225 | 12/1988 | Japan | 437/73 |

OTHER PUBLICATIONS

Martin, R., "Spacer for Improved Local Oxidation Profile", *Xerox Disc. Bull.* vol. 12, No. 5, Sep. 10, 1987.
Wolf, S., et al, *Silicon Processing for the VLSI Era*, vol. 1, p. 552, 1986.
Wolf, S., et al, *Silicon Processing for the VLST Era*, vol. 2, pp. 21-29 & 37, 1990.

*Primary Examiner*—Olik Chaudhuri
*Assistant Examiner*—G. Fourson
*Attorney, Agent, or Firm*—Nixon & Vanderhye

[57] ABSTRACT

An improved LOCOS method for forming an isolation region with a higher breakdown voltage and a reduced width in a semiconductor device, comprising the steps of:

(a) forming on a silicon substrate a silicon nitride layer having a predetermined pattern and a tapered-slant side wall, between the silicon nitride layer and the silicon substrate being formed a silicon oxide layer, (b) subjecting the silicon substrate to an isotropic etching using the silicon nitride layer as a mask to form a recess on the substrate, the recess extending to and under the side wall of the silicon nitride layer, and (c) forming a channel stopper region by implanting an impurity into the silicon substrate through the recess-formed surface, and thereafter growing and forming a LOCOS layer on the recess-formed surface to obtain an isolation region.

6 Claims, 3 Drawing Sheets

METHOD FOR FORMING ISOLATION REGION OF SEMICONDUCTOR DEVICE

BACKGROUND OF THE INVENTION

1. Field of the Invention

The invention relates to a method for forming an isolation region on a silicon substrate in a semiconductor device, and more particularly, to a forming method for an isolation region between device components which region consists of a LOCOS layer and provides isolation between device-formed regions in a semiconductor device.

2. Description of the Related Art

An isolation region between device component in a semiconductor device is conventionally formed in such a manner that a silicon oxide layer 12 and a silicon nitride layer 13 are laminated in the order on a silicon substrate 11 as shown in FIG. 4(a), that layers are etched in a predetermined pattern to expose a silicon surface as shown in FIG. 4(b), impurities are fed through the exposed silicon surface to form a P$^-$ layer 14 of a channel stopper as shown in FIG. 4(c), and the local oxidation of silicon isolation using SiN layer 13 as a mask (LOCOS method) is carried out to form a silicon oxide layer 15 as shown in FIG. 4(d).

In recent years, as devices are further subminiaturized, it is required to form an isolation region between device components in submicron width. However, the submicron isolation region has a problem that the resistibility to punch-through between device components is deteriorated due to a short channel effect.

Meanwhile, a high voltage device is required to have higher values of a field reverse voltage and a breakdown voltage of n$^+$/p junction. It is necessary to reduce the amount of impurities in the channel stopper region for raising the breakdown voltage of n$^+$/p junction. In this case, there occurs another problem such as the field reverse voltage lowers. Conventionally, an oxide layer according to the LOCOS method is made thicker to mitigate the problem, resulting in a larger width of birdsbeak (an unnecessary oxidized region in a bird's beak-like shape) and that it is not conformable to further subminiaturize devices.

In this regard, the birdsbeak widths may be made smaller by changing specific conditions for the LOCOS method. However, the isolation region with the birdsbeak of smaller width has an acute rise as shown in FIG. 5 (a) and therefore, the silicon oxide isolation region 15 is stressed by the edge portion of the silicon nitride layer 13 (arrow 16) under growing and also a steep step 17 having a residual stress is developed after the removal of the silicon nitride layer 13.

Related to this, such a proposal has been made that an isotropic etching is applied to the surface of a semiconductor substrate before subjected to the LOCOS method to form a recess extending to and under an edge of a patterned silicon nitride layer formed as a mask on the substrate, and thereafter a LOCOS oxide layer is grown and formed at the recess, so that there is formed an isolation region free of a steep rise and mitigated in stress from the pattern end. (Japanese Unexamined Patent Publication No. 280437/1988).

An object of the invention is to provide an improved LOCOS method for forming an isolation region which has a smaller width and is further mitigated in stress by the end of the patterned silicon nitride layer used as a mask.

SUMMARY OF THE INVENTION

According to the present invention, there is provided a method for forming an isolation region in a semiconductor device, comprising the steps of:

(a) forming on a silicon substrate a silicon nitride layer having a predetermined pattern and a tapered-slant side wall, between the silicon nitride layer and the silicon substrate being formed a silicon oxide layer, (b) subjecting the silicon substrate to an isotropic etching using the silicon nitride layer as a mask to form a recess on the substrate, the recess extending to and under the side wall of the silicon nitride layer, and (c) forming a channel stopper region by implanting an impurity into the silicon substrate through the recess-formed surface, and thereafter growing and forming a LOCOS layer on the recess-formed surface to obtain an isolation region.

DETAILED DESCRIPTION OF THE PREFERRED EMBODIMENTS

Figure 1:
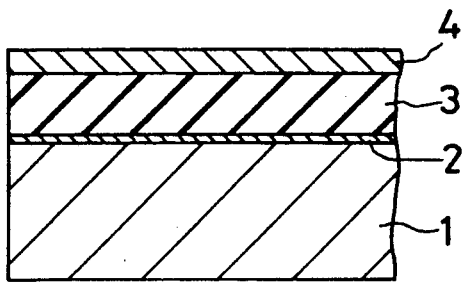
FIGS. 1 (a)–(e) are explanatory views showing the steps in the examples of the present invention.
Figure 1:
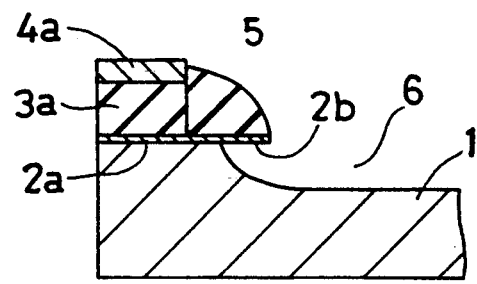
Figure 1:
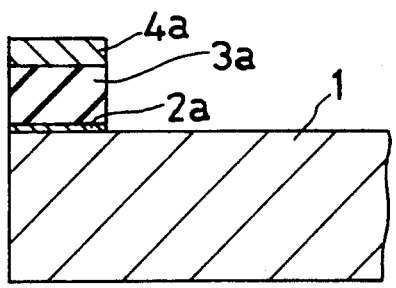
Figure 1:
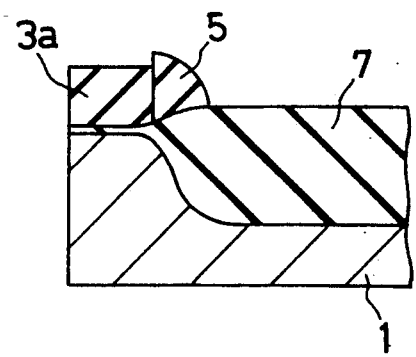
Figure 1:
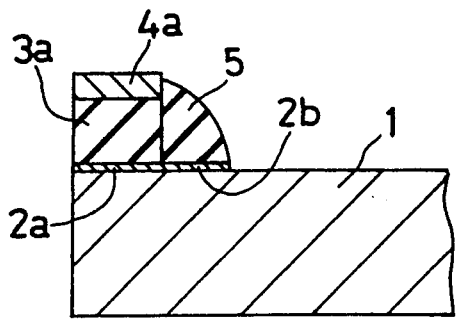

In the present invention, at first, a silicon nitride layer in a predetermined pattern and with a tapered-slant side wall is formed on a silicon substrate, having an intermediate silicon oxide layer (Step (a)).

The pattern of the silicon nitride layer is used as an etching mask for forming a recess on the silicon substrate as well as a mask for LOCOS formation, and includes a step of depositing and patterning of silicon nitride and a subsequent step of forming the side wall portion. Such a formation of the side wall portion is not applied in the conventional LOCOS method.

The pattern of the abovesaid silicon nitride layer may for example, be formed as follows.

At first, a silicon oxide layer generally of 10 to 30 nm in thickness is formed on the surface of the silicon substrate by usual thermal oxidation. Then, a silicon nitride layer generally of 150 to 250 nm in thickness is formed on the silicon oxide layer by a CVD method. Further, on the silicon nitride layer is formed by a CVD method a glass layer (for example, NSG, PSG, BPSG or the like) generally of 100 to 300 nm in thickness which serves as a mask for the silicon nitride layer during the formation of the side wall as described below. Thereafter, the glass layer, silicon nitride layer and silicon oxide layer are etched in this order through a photolithographical method to be in a predetermined pattern. Then, the second silicon nitride layer generally of 150 to 250 nm in thickness is formed again, through an intermediate silicon oxide layer (generally 10 to 30 nm in thickness), on the exposed area of the silicon substrate developed by the above etching, and thereafter, the second silicon nitride layer with the intermediate silicon oxide layer is subjected to an anisotropic etching to form a tapered-slant side wall portion of silicon nitride thereby obtaining the specific silicon nitride layer of the present invention having a predetermined pattern consisting of the first silicon nitride layer and the above side wall portion.

The next step to be carried out in the present invention is to etch the silicon substrate by using the silicon nitride layer pattern as a mask so as to form on the silicon substrate a recess which extends to and under the side wall portion of the silicon nitride layer (Step (b)).

The recess defines the area for the growth of the silicon oxide for an isolation region between device-forming regions, and suitably has 700 to 1400 Å of width and 1000 to 2000 Å of depth, and extends to and under the tapered-slant side wall portion of the patterned silicon nitride layer. The recess has also a tapered surface under the tapered-slant side wall portion. Formation of the recess may be effected by a so-called taper etching, in turn, the isotropic etching using the silicon nitride layer as a mask.

The third step is to implant an impurity into the silicon substrate through the recess-formed surface and then oxidize the surface layer of the recess in accordance with the LOCOS method to grow and form an isolation region made of silicon oxide (Step (c)).

The above impurity is for forming a channel stopper region in the substrate and may use, for example, B+ and the like. The impurity is implanted according to a conventional ion implantation method and the amount of impurity to be implanted is preferably $3 \times 10^{13}$ to $6 \times 10^{13}/cm^2$. The glass layer is usually removed before or after the implantation.

The conventional LOCOS method may be applied for the formation step of the isolation region of the present invention, and preferable conditions thereof is under 1000° to 1100° C. and 90 to 95% RH. The isolation region between device-forming regions formed in accordance with the method of this invention is in a shape not so long rising up but generally flat as having 20° to 30° of a tapered angle at the upper end as shown, for example, in FIGS. 1(d) (reference 6) and 1(e). Hence, even when an oxide layer is grown and formed on the recess surface under a condition preventing birdsbeak, no steep step is developed between the LOCOS layer and the silicon nitride layer, thereby notably mitigating stress to the LOCOS layer by the side wall portion of the silicon nitride layer. In addition, the surface of the side wall portion of the silicon nitride layer is gently tapered (inclined) and does not have a rectangular cross-section (see FIG. 1 (d)), so that stress possibly caused by the silicon nitride layer to the end of the LOCOS layer can be largely mitigated in comparison with the conventional method even when the LOCOS layer has a more or less longer rise.

On the basis of the improved flatness and the reduced stress as aforementioned, the semiconductor device using the isolation region formed by the present method can enjoy an improved dielectric strength of the isolation region and a notably reduced leakage current, for example, passing through the junction layer of a MOS transistor device.

Furthermore, according to the method of the present invention, a specific side wall portion in addition to the usual silicon nitride layer pattern is utilized, and therefore the width of the isolation region between device components can further be reduced with respect to the width of the side wall portion, thereby enabling a further subminiaturized isolation region to be effectively formed.

EXAMPLES

Next, an example of the present invention will be detailed with referring to the attached drawings.

First, as shown in FIG. 1(a), a silicon oxide layer 2 (10 nm thick) was deposited on a silicon substrate 1 by a thermal oxidation method, on which a silicon nitride layer 3 (160 nm) was deposited by a CVD method, followed by the deposition of a non-doped silicate glass (NSG) layer 4 (100 nm) on the silicon nitride layer 3 by a CVD method.

Next, the NSG layer 4, silicon nitride layer 3 and thin silicon oxide layer 2 were etched in a predetermined pattern by the photolithography method to obtain a silicon oxide layer 2a, a silicon nitride layer 3a and a NSG layer 4a as shown in FIG. 1(b).

Then, as shown in FIG. 1(c), a silicon oxide layer 2b (10 nm) was formed again by the thermal oxidation method on the silicon substrate 1 exposed by the above etching, on which a silicon nitride layer (200 nm) was deposited, and thereafter these two layers were etched by a reactive ion etching method (RIE) to form a tapered-slant side wall portion 5 having a width of 1500 Å.

Then, an isotropic etching was applied to the exposed silicon substrate 1. In this example, a plasma etching method ($CF_4$ gas) is used as the isotropic etching, thereby forming an recess 6 which has 1050 Å of width and 1500 Å of depth and has an offset area extending to and under the side wall portion 5 as shown in FIG. 1(d). The width of the offset was approx. 1000 Å. Then, boron ion was implanted into the silicon substrate through the surface of the recess 6 by the use of ion implantation apparatus to form a channel stopper region of a boron concentration of $5 \times 10^{13}/cm^2$ in the substrate, and then the NSG layer 4a was removed. Thereafter, the recess-formed surface was oxidized by a LOCOS method under 1050° C., 90% RH to grow and form an isolation region 7 of the present invention made of an oxide (LOCOS) layer (FIG. 1(e)).

Then, the silicon substrate was boiled in a phosphoric acid solution to remove the silicon nitride layer 3a with its side wall portion 5, and then, the resultant was subjected to a conventional CMOS process to form a semiconductor device (CMOS device).

Figure 2:
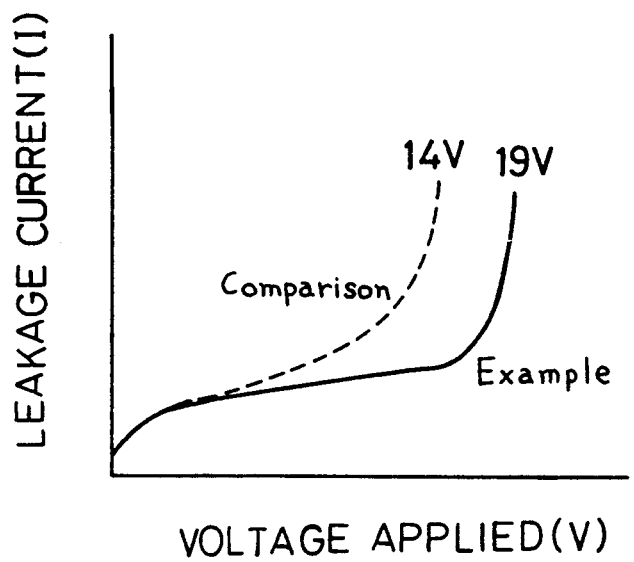
FIGS. 2 and 3 are graphs each comparatively showing an effect by the semiconductor device according to the present invention.

Next, characteristics of the obtained semiconductor device will be detailed. The shape of the silicon oxide layer serving the isolation region between CMOS device components is not convex but substantially plain as tapered at 20° to 30° due to the presence of the recess. The I–V characteristic of the $n^+$ junction in the CMOS device is shown in FIG. 2 in comparison with that of the conventional CMOS device which was fabricated by the similar manner to the above example provided that no side wall portion was formed in respect of the silicon nitride layer pattern. This figure reveals that the breakdown voltage of $n^+/p$ junction in the device having the isolation region formed by the present invention is much higher than that of the comparative device. Also revealed is that the breakdown voltage of the isolation region is improved as the depth of the recess increases. Especially, an increase of 4 to 5 V in breakdown voltage is shown at about 1500 Å of the depth. The leakage current also shows a less voltage dependency in comparison with the conventional LOCOS layer. Although the device according to the present invention provides at about 5 V an equal leakage current (approx. $2 \times 10^{-13}$ A/mm) to the conventional one, such a reduced leakage current as about one third of the conventional one can be obtained at about 10 V.

Since the formation of the LOCOS layer in accordance with the present invention is conducted after provision of the offset recess, the LOCOS layer is not upwardly convex. In addition to this, the SiN layer used as a mask curves gently at the side wall portion. Resultantly, it is considered that the stress applied to the end of the LOCOS layer to be formed is greatly lowered thereby exhibiting a largely reduced leakage current.

Figure 3:
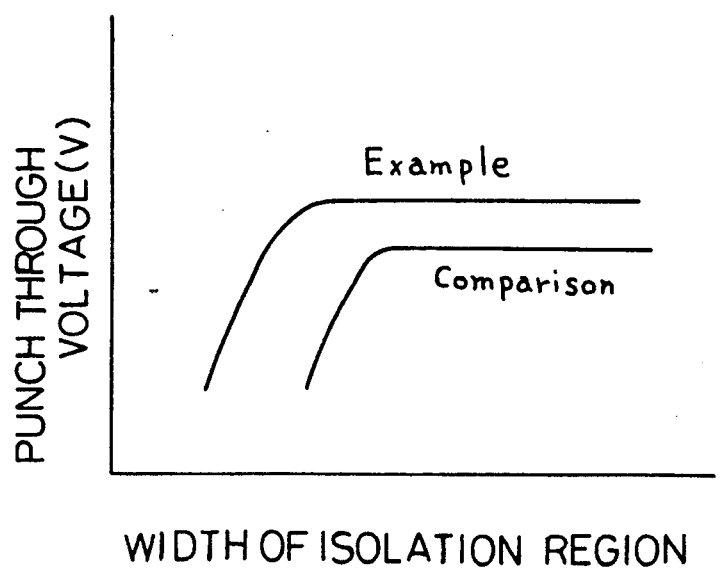
Figure 4:
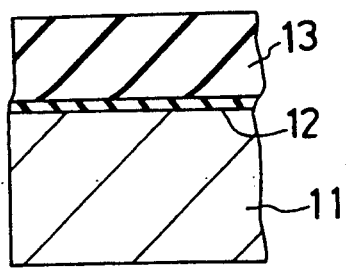
FIGS. 4 (a)–(d) and 5 (a)–(b) are explanatory views showing the steps of a conventional forming method for an isolation region.
Figure 4:
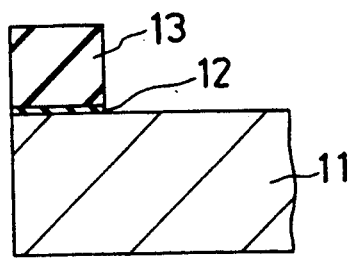
Figure 4:
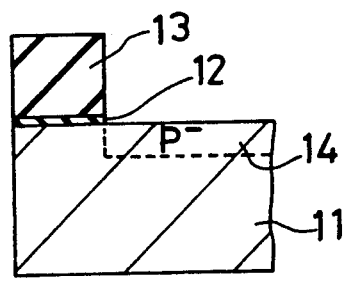
Figure 4:
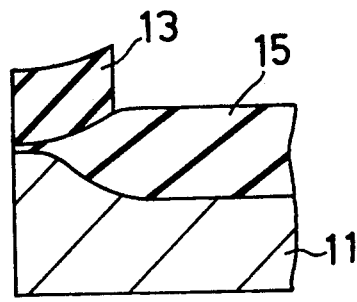
Figure 5:
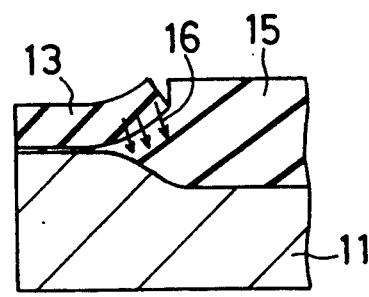
Figure 5:
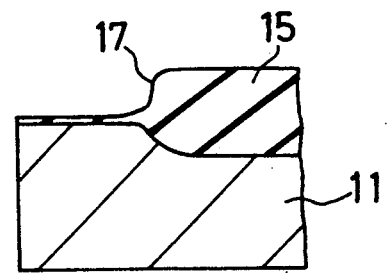

The punch-through characteristic of a metal-gate field transistor using the isolation region according to the present invention is also shown in FIG. 3 in which a typical dependency of the starting voltage for allowing punch-through upon the width of the isolation region is shown. As the isolation region width is narrower, the resistibility against punch-through is deteriorated. However, it was confirmed that the method of the invention enables the isolation region to be formed as being higher in resistibility against punch-through by about 0.2 to 0.3 μm based on the width in comparison with the conventionally formed isolation region. Therefore, a fine isolation region having a much smaller size in a submicron range can be applied for semiconductor devices.

In summary, according to the present invention, an improved isolation region having a smaller width and a higher breakdown voltage and being less in birdsbeak shift can be formed efficiently. Hence, by using the method of the present invention, a semiconductor device, for example a CMOS device, having fine isolation regions between device components in submicron range and being excellent in resistibility to a high voltage can be fabricated.

What is claimed is:

1. A method for forming an isolation region in a semiconductor device, comprising the steps of:

(a) forming on a silicon substrate a silicon oxide layer and thereafter forming on the silicon oxide layer a silicon nitride layer having a predetermined pattern and a tapered-slant side wall, (b) subjecting the silicon substrate to an isotropic etching using the silicon nitride layer as a mask to form a recess in the substrate, the recess extending to and under the side wall of the silicon nitride layer and formed to have a tapered surface positioned under said tapered-slant side wall, and (c) forming a channel stopper region by implanting an impurity into the silicon substrate through the recess-formed surface, and thereafter growing and forming a field oxide layer on the recess-formed surface to obtain an isolation region, wherein said recess formed in the substrate has a depth of about 1000 to 2000 Å, a width of about 700 to 1400 Å and said field oxide layer has a tapered angle of about 20° to 30°.

2. The method for forming an isolation region of claim 1 in which the silicon nitride layer having a predetermined pattern and a tapered-slant side wall has a thickness of about 150 to 250 nm.

3. The method for forming an isolation region of claim 1 in which the silicon oxide layer between the silicon nitride layer and the silicon substrate has a thickness of about 10 to 30 nm.

4. The method for forming an isolation region of claim 1 in which the isotropic etching is a plasma etching.

5. The method for forming an isolation region of claim 1 in which the impurity is implanted into the silicon substrate at a concentration of $3 \times 10^{13}$ to $6 \times 10^{13}/cm^2$.

6. The method for forming an isolation region of claim 1 in which said field oxide layer is grown and formed under a temperature of 1000° to 1100° C. and a moisture of 90 to 95% RH.

* * * * *